United States Patent [19]

Kashiwaba et al.

[11] Patent Number: 4,942,371
[45] Date of Patent: Jul. 17, 1990

[54] PHASE-LOCKED LOOP HAVING IMPROVED INPUT JITTER CHARACTERISTICS

[75] Inventors: Satoshi Kashiwaba; Masahiro Nakajima, both of Tokyo, Japan

[73] Assignee: NEC Corporation, Japan

[21] Appl. No.: 399,330

[22] Filed: Aug. 28, 1989

[30] Foreign Application Priority Data

Aug. 31, 1988 [JP] Japan .................................. 63-217936

[51] Int. Cl.$^5$ ............................................ H03L 7/093
[52] U.S. Cl. ........................................ 331/14; 331/17
[58] Field of Search ..................................... 331/14, 17

[56] References Cited

U.S. PATENT DOCUMENTS 4,007,429 2/1977 Cadalora et al. ...................... 331/17

OTHER PUBLICATIONS

Phaselock Techniques by F. M. Gardner P9–P13, John Wiley & Sons, 1979.

Primary Examiner—Siegfried H. Grimm
Attorney, Agent, or Firm—Laff, Whitesel, Conte & Saret

[57] ABSTRACT

In a phase-locked loop, a phase comparator, a low-pass filter, and a voltage-controlled oscillator are connected in a loop form. The phase-locked loop includes a switching circuit, arranged between the low-pass filter and the voltage-controlled oscillator, for switching an output signal from the phase comparator or an output signal from the low-pass filter to input the selected output signal to the voltage-controlled oscillator, and an input/output signal monitor circuit for controlling a switching timing of the switching circuit in response to a synchronization state between an input signal to the phase comparator and an output signal from the voltage-controlled oscillator, and in accordance with frequency components of the input signal.

3 Claims, 2 Drawing Sheets

PHASE-LOCKED LOOP HAVING IMPROVED INPUT JITTER CHARACTERISTICS

BACKGROUND OF THE INVENTION

The present invention relates to a phase-locked loop (to be referred to as a PLL hereinafter) and, more particularly, to a PLL with improved input jitter characteristics.

FIG. 1 is a block diagram showing a conventional PLL. In FIG. 1, reference numeral 1 denotes a phase comparator; 2, a voltage-controlled oscillator; and 3, a low-pass filter.

In the conventional PLL of this arrangement, an input signal S1 is compared with an output signal S4 of the voltage-controlled oscillator 2 by the phase comparator 1. An output signal S2 as a comparison result of these signals is input to the low-pass filter 3, and the voltage-controlled oscillator 2 is controlled by an output signal S3 filtered through the filter 3.

In the arrangement of the conventional PLL, a jitter pass band (noise band width) is narrowed as much as possible to maintain good output jitter characteristics.

In the conventional PLL, however, a hysteresis exists in the synchronization characteristics of the PLL with respect to an input low-frequency jitter amount characteristic to FM modulation. Therefore input jitter characteristics are degraded. In other words, since hysteresis is present with respect to a change in frequency shift amount in the low-frequency modulation range of the FM modulation, input jitter characteristics are degraded.

SUMMARY OF THE INVENTION

It is therefore a principal object of the present invention to provide a PLL with improved input jitter characteristics.

In order to achieve the above object, according to an aspect of the present invention, there is provided a phase-locked loop in which a phase comparator, a low-pass filter, and a voltage-controlled oscillator are connected in a loop form, comprising switching means, arranged between the low-pass filter and the voltage-controlled oscillator, for switching an output signal from the phase comparator or an output signal from the low-pass filter to input the selected output signal to the voltage-controlled oscillator, and input/output signal monitoring means for controlling a switching timing of the switching means in response to a synchronization state between an input signal to the phase comparator and an output signal from the voltage-controlled oscillator, and in accordance with frequency components of the input signal.

DESCRIPTION OF THE PREFERRED EMBODIMENT

Figure 1:
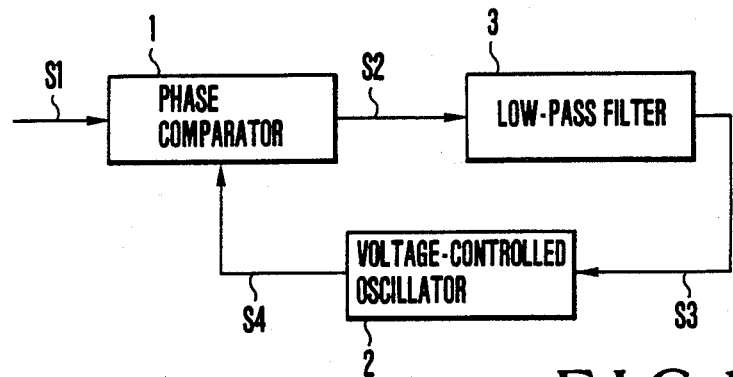
FIG. 1 is a block diagram of a conventional PLL.
Figure 2:
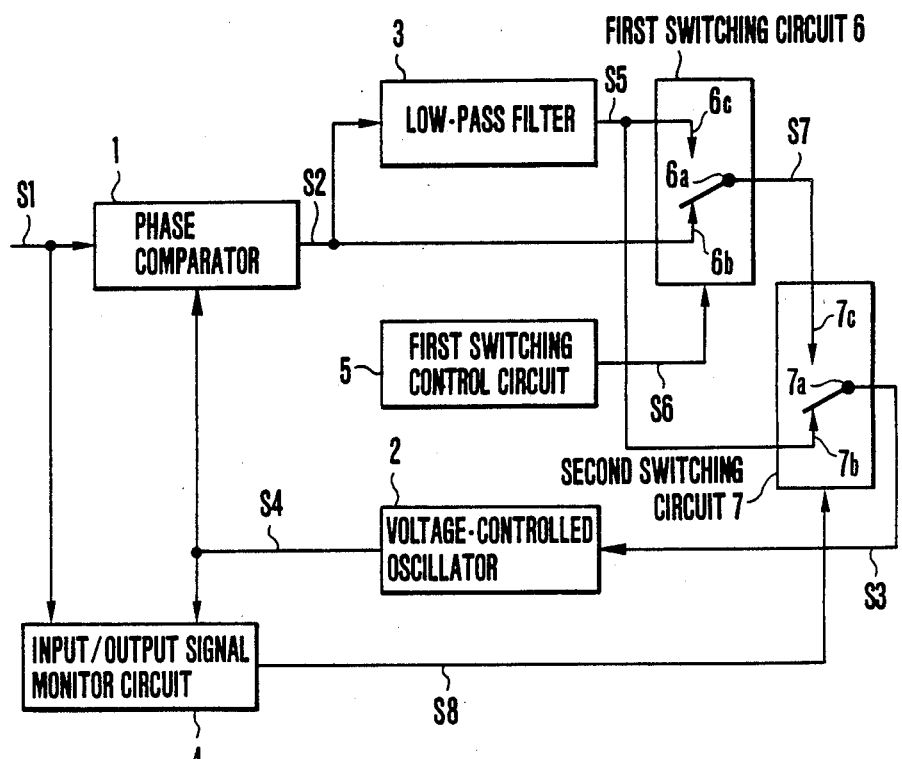
FIG. 2 is a block diagram showing a first embodiment according to the present invention.

FIG. 2 is a block diagram showing the first embodiment of the present invention. The same reference numerals in FIG. 2 denote the safe parts as in FIG. 1. Reference numeral 4 denotes an input/output signal monitor circuit; 5, a first switching control circuit; 6, a first switching circuit; and 7, a second switching circuit. The first switching control circuit 5 outputs a rectangular-wave pulse signal having a duty ratio of 50%. The first switching circuit 6 switches inputs in response to a continuously and periodically changing pulse signal supplied from the first switching control circuit 5.

In the PLL of this embodiment, a phase of an input jitter signal S1 characteristic to FM modulation (to be referred to as an FM modulation signal) is compared with a phase of an output signal S4 from a voltage-controlled oscillator 2 by a phase comparator 1. An output signal S2 including a high-frequency signal component is filtered through a low-pass filter 3 to obtain a low-frequency signal component S5. The low-frequency signal component S5 and the output signal S2 are switched by the first switching circuit 6 which is controlled by the first switching control circuit 5 for continuously performing control on the basis of a given synchronization state, thus outputting an output signal S7. The switching cycle in this case is about 0.125 Hz when the modulation frequency of an FM modulation signal is, e.g., 450 Hz. However, the present invention is not limited to these values.

The output signal S7 from the first switching circuit 6 and the low-frequency signal component S5 from the low-pass filter 3 are switched by the second switching circuit 7 which is controlled by a second switching circuit control signal S8 from the input/output signal monitor circuit 4, thus outputting a voltage-controlled oscillator control signal S3. The voltage-controlled oscillator control signal S3 controls the voltage-controlled oscillator 2.

When the voltage-controlled oscillator output signal S4 is synchronous with the FM modulation signal S1, the input/output signal monitor circuit 4 switches a movable contact 7a of the second switching circuit 7 to a stationary contact 7b side, so that the low-frequency signal component S5 from the low-pass filter 3 is output as the voltage-controlled oscillator control signal S3.

When the voltage-controlled oscillator output signal S4 is asynchronous with the FM modulation signal S1, the input/output signal monitor circuit 4 monitors the modulation frequency component of the FM modulation signal S1, and performs the following operation in accordance with the modulation frequency component.

More specifically, in a frequency range where a hysteresis is present, the monitor circuit 4 controls to switch the movable contact 7a of the second switching circuit 7 to a stationary contact 7c side, so that the output signal S7 from the first switching circuit 6 is output from the second switching circuit 7. In a frequency region where a hysteresis exists, the first switching circuit 6 selectively outputs the low-frequency signal component S5 of the phase comparator output signal S2 and the phase comparator output signal S2 including the high-frequency signal component for given cycles under the control of the first switching control circuit 5. When the first switching circuit 6 is switched to control the low-frequency signal component S5 of the phase comparator output signal S2, the voltage-controlled oscillator output signal S4 follows the FM modulation signal S1 due to the response characteristics of the PLL, thus eliminating the hysteresis.

In a range where no hysteresis is present, the monitor circuit 4 controls the second switching circuit 7 to output the low-frequency signal component S5 without going through the first switching circuit 6.

Figure 3:
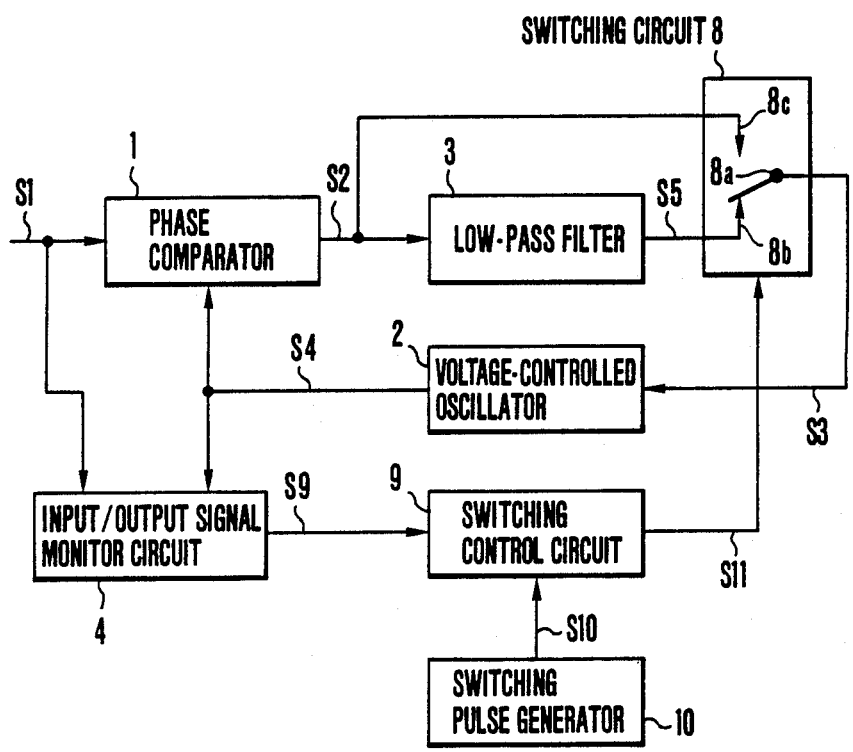
FIG. 3 is a block diagram showing a second embodiment according to the present invention.

FIG. 3 is a block diagram showing a second embodiment of the present invention. The same reference numerals in FIG. 3 denote the same parts as in FIG. 2. Reference numeral 8 denotes a switching circuit; 9, a switching control circuit; and 10, a switching pulse generator. The switching pulse generator 10 generates a periodic and continuous pulse signal having a duty ratio of 50% to control the switching circuit 9. For example, the switching cycle in this case is about 0.125 Hz when the modulation frequency of an FM modulation signal is, e.g., 450 Hz. However, the present invention is not limited to these values.

In this embodiment, the single switching circuit 8 switches an output signal S2 from a phase comparator 1 and its low-frequency signal component S5 to output a voltage-controlled oscillator control signal S3. The switching circuit 8 is switched be a switching circuit control signal S11 from the switching control circuit 9 which is controlled by a control signal S9 from an input/output signal monitor circuit 4 and a switching pulse signal S10 from the switching pulse generator 10.

When an FM modulation signal S1 is synchronous with a voltage-controlled oscillator output signal S4, the input/output signal monitor circuit 4 supplies the synchronous control signal S9 to the switching control circuit 9, and the switching control circuit 9 controls to output the low-frequency signal component S5 of the phase comparator output signal S2 as the voltage-controlled oscillator control signal S3 from the switching circuit 8.

When the FM modulation signal S1 is asynchronous with the voltage-controlled oscillator output signal S4, the input/output signal monitor circuit 4 monitors the modulation frequency component of the FM modulation signal S1, and supplies the control signal S9 based on the modulation frequency component data to the switching control circuit 9. The switching control circuit 9 continuously controls the switching circuit 8 to switch the phase comparator output signal S2 and its low-frequency component S5 under the control of the switching pulse signal S10 having a given period and generated by the switching pulse generator 10 in a range where a hysteresis is present.

In a range where no hysteresis is present, the switching control circuit 9 controls the switching circuit 8 to output the low-frequency signal component S5 of the phase comparator output signal S2.

As described above, according to the present invention, the low-frequency signal component of the phase comparator output signal and the phase comparator output signal including the high-frequency signal component are continuously switched for given cycles to control the VCO, thereby providing a PLL circuit which can eliminate a hysteresis existing in the synchronization characteristics of the PLL circuit with respect to an input jitter amount characteristic to FM modulation, and can prevent input jitter characteristics from being impaired.

What is claimed is:

1. A phase-locked loop in which a phase comparator, a low-pass filter, and a voltage-controlled oscillator are connected in a loop form, comprising:
    switching means, arranged between said low-pass filter and said voltage-controlled oscillator, for switching an output signal from said phase comparator or an output signal from said low-pass filter to input the selected output signal to said voltage-controlled oscillator; and
    input/output signal monitoring means for controlling a switching timing of said switching means in response to a synchronization stare between an input signal to said phase comparator and an output signal from said voltage-controlled oscillator, and in accordance with frequency components of said input signal.

2. A phase-locked loop (PLL) for establishing phase synchronization, comprising:
    a phase comparator for detecting a phase difference between an input signal and an output signal from a voltage-controlled oscillator;
    a first switching circuit for switching to an output a low-frequency signal component of a phase comparator output signal or said phase comparator output signal including a high-frequency signal component;
    a first switching control circuit for generating a switching control signal for said first switching circuit;
    a second switching circuit for selectively providing at an output the output signal from said first switching circuit or the low-frequency signal component of the phase comparator output signal in accordance with a synchronization/asynchronization state of said voltage-controlled oscillator and frequency components of the input signal;
    an input/output signal monitor circuit for monitoring the synchronization/asynchronization state of said voltage-controlled oscillator and the frequency components of the input signal to provide a control signal to said second switching circuit; and
    a circuit for controlling said voltage-controlled oscillator in accordance with the output signal from said second switching circuit.

3. A method for establishing phase synchronization in a phase-locked loop (PLL), including phase comparator means, low-pass filter means, and a voltage-controlled oscillator, comprising:
    detecting a phase difference between an input signal and an output signal from said voltage-controlled oscillator;
    extracting a low-frequency signal component from the detection result;
    selecting one of the detection result and the low-frequency signal component; and
    providing to said voltage controlled oscillator the selection result or the low-frequency signal component in accordance with a synchronization/asynchronization state of said voltage-controlled oscillator and frequency components of the input signal.

* * * * *